United States Patent
Kitai et al.

(10) Patent No.: US 7,907,442 B2
(45) Date of Patent: Mar. 15, 2011

(54) SEMICONDUCTOR INTEGRATED CIRCUIT (75) Inventors: Naoki Kitai, Akishima (JP); Satoru Hanzawa, Hachioji (JP); Akira Kotabe, Hino (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 149 days.

(21) Appl. No.: 12/445,075

(22) PCT Filed: Oct. 12, 2006

(86) PCT No.: PCT/JP2006/320370
§ 371 (c)(1),
(2), (4) Date: Apr. 9, 2009

(87) PCT Pub. No.: WO2008/044300
PCT Pub. Date: Apr. 17, 2008

(65) Prior Publication Data
US 2010/0073999 A1 Mar. 25, 2010

(51) Int. Cl.
G11C 11/00 (2006.01)
G11C 7/10 (2006.01)
(52) U.S. Cl. .......................... 365/163; 365/207
(58) Field of Classification Search .................. 365/163, 365/148, 207, 205
See application file for complete search history.

(56) References Cited

U.S. PATENT DOCUMENTS

| 7,280,391 B2 * | 10/2007 | Kang et al. | 365/163 |
| 7,397,695 B2 * | 7/2008 | Nakai et al. | 365/163 |
| 7,453,715 B2 * | 11/2008 | Parkinson | 365/148 |

FOREIGN PATENT DOCUMENTS

| JP | 10-050072 A | 2/1998 |
| JP | 2001-216794 A | 8/2001 |
| JP | 2003-173686 A | 6/2003 |

* cited by examiner

*Primary Examiner* — Anh Phung
(74) *Attorney, Agent, or Firm* — Miles & Stockbridge P.C.

(57) ABSTRACT

In a readout circuit (RC) which detects a difference between a change that appears on a first signal line (CBL) and a change that appears on a second signal line (CBLdm) according to stored information of each selected memory cell, the first signal line and the second signal line are separated selectively from input nodes of a data latch circuit (DL) through second MOS transistors (MN3 and MN4) and capacitively coupled to the input nodes of the data latch circuit via gates of first MOS transistors (MP1 and MP2) respectively. In this separated state, the first and second signal lines and the input nodes of the data latch circuit are precharged to different voltages, so that the gate-to-source and drain-to-source voltages of the first MOS transistors are controlled by the voltages of the first and second signal lines respectively. Therefore, when the first and second signal lines are varied and the separated state is released upon a read operation, the first MOS transistors start to operate in a saturated region, thereby realizing a high-speed read operation.

15 Claims, 10 Drawing Sheets

SEMICONDUCTOR INTEGRATED CIRCUIT

TECHNICAL FIELD

The present invention relates to a semiconductor device having a memory and relates to a technique effective when applied to reading at high speed from a memory cell small in read signal level such as a Phase Change Memory or the like.

BACKGROUND ART

A circuit technology which amplifies a difference in potential between a bit line pair using a preamplifier having a configuration in which a bit line is coupled to the gate and drain of each MOS transistor with respect to each memory cell that performs a low current operation upon reading and which assists in a differential amp operation of a subsequent stage, has been disclosed in a patent document 1. For example, one data line is coupled to one differential input terminal of a differential amplifier and one data line is coupled to the other differential input terminal of the differential amplifier. The one data line can be discharged by a parallel circuit of n channel type first and second MOS transistors, whereas the other data line can be discharged by a parallel circuit of n channel type second and second MOS transistors. The gate of the first MOS transistor is coupled to the one data line and the second MOS transistor is coupled to the other data line. The gate of the third MOS transistor is coupled to the other data line and the fourth MOS transistor is coupled to the one data line. When both data lines are precharged before the read operation and thereafter memory cells coupled to one data line are selected, a current corresponding to the difference in conductance between the selected memory cells flows through the one data line. An intermediate reference current based on the difference in conductance flows through the other data line. Thus, a difference in potential is formed between both data lines. At this time, the first through fourth MOS transistors are coupled to a circuit's ground to form discharge paths for the data lines. Since the current that flows through the first and second MOS transistors and the current that flows through the third and fourth MOS transistors become equal to each other by coupling configurations of the first through fourth MOS transistors, the difference in potential between both data lines is amplified by the time accumulation of differences in current value. This thus enables high-speed reading even when a read signal level is small.

Patent Document 1: Japanese Unexamined Patent

DISCLOSURE OF THE INVENTION

Problems that the Invention is to Solve

In a phase change memory, each memory cell comprises a selection transistor and a phase change element. When a high voltage greater than or equal to a threshold voltage is applied between two terminals of the phase change element, its resistance value changes. Namely, stored information is rewritten. In order to avoid the destruction of the stored information, the voltage applied to each bit line upon reading is limited. On the other hand, the voltage between the drain and source of each selection transistor becomes a value obtained by voltage-dividing the bit line voltage in accordance with the resistance value of the phase change element. Therefore, when the resistance value rises depending on a material that forms the phase change element, the voltage applied to the selection transistor is reduced, so that a memory cell current decreases. Upon a read operation of a semiconductor memory, a sense amplifier is generally enabled after the difference in potential between a bit line pair has been brought to a sufficient value, in consideration of variations in the threshold voltage of each MOS transistor of the sense amplifier and the like. A problem, however, arises in that since the time is required until the difference in potential between the bit line pair becomes large where the memory cell current of the phase change memory is small, a delay time from word line enable to sense amp enable increases.

It has been revealed by the present inventors that although it is also possible to apply the technology of the patent document 1 to this problem, the amplifying operations by the first through fourth MOS transistors of the patent document 1 cannot be expected where the voltage itself of each data line is low. When the bit line voltage cannot be raised to prevent the destruction of the stored information, the level of the data line voltage cannot be simply raised and hence high-speed reading cannot be carried out.

An object of the present invention is to provide a semiconductor integrated circuit equipped with a readout circuit, which is capable of performing necessary amplification in a short period of time using a preamplifier even though a read signal level for each bit line is small.

Another object of the present invention is to provide a semiconductor integrated circuit equipped with a readout circuit, which is capable of performing high-speed reading while preventing beforehand the risk of stored information of a phase change memory cell being destroyed.

The above and other objects and novel features of the present invention will become apparent from the description of the present specification and the accompanying drawings.

Means for Solving the Problems

A summary of typical ones of the inventions disclosed in the present application will be explained in brief as follows:

[1] A semiconductor integrated circuit (1, 1_A) according to the present invention is provided with a readout circuits (RC, RC_A, RC_B, RC_C) which detects a difference between a change that appears on a first signal line (CBL, BLT) and another change that appears on a second signal line (CBLdm, BLB), according to stored information of a memory cell selected from a plurality of memory cells (MC11 through MCmn), thereby to determine the stored information. The readout circuit includes a first initialization circuit (PC1, PC4, PC5) which initializes the first signal line and the second signal line to a first level before the start of a read operation thereof, a preamplifier (PA, PA1) which amplifies changes in initialization levels of the first and second signal lines respectively upon the read operation and outputs the same therefrom, a data latch circuit (DL, DL1, DL2) which receives a pair of outputs of the preamplifier at input nodes (SAIN, SAINB) to perform a latch operation, and a second initialization circuit (PC2, PC6) which initializes input nodes of the data latch circuit to a second level before the start of the read operation. The preamplifier includes a pair of first MOS transistors (MP1, MP2, MN14, MN15) one of which receives the first signal line at a gate thereof and couples the first signal line to the corresponding input node of the data latch circuit through an input gate capacitance and the other of which receives the second signal line at a gate thereof and couples the second signal line to the corresponding input node of the data latch circuit through an input gate capacitance, and a pair of second MOS transistors (MN3, MN4, MP14, MP15) which couples the one first MOS transistor to the first signal line and couples the other first MOS transistor to the second signal line and which is on-operated after the initialization.

According to the above means, the first signal line and the second signal line are selectively separated from the input nodes of the data latch circuit through the second MOS transistors, and capacitively coupled to their corresponding input nodes of the data latch circuit through the first MOS transistors. Thus, the first and second signal lines and the input nodes of the data latch circuit are precharged to different voltages of first and second voltages in the separated state, so that the gate-to-source and drain-to-source voltages of the first MOS transistors that configure the preamplifier are controlled by voltages of the first and second signal lines respectively. Therefore, when upon the read operation, the first and second signal lines are varied in accordance with the stored information of each memory cell and the separated state by the second MOS transistors of the preamplifier is released, the first MOS transistors start to operate in a saturated region, thereby enhancing amplifying sensitivity thereof and realizing a high-speed read operation.

As one concrete form or configuration of the present invention, the first signal line and the second signal line are discharged from the first level upon the read operation. The first level is of a level lower than the second level. Preferably at this time, the first level is a level lower than half of a differential voltage between the first and second levels, the second MOS transistors are n channel types (MN3, MN4), and the first MOS transistors are p channel types (MP1, MP2). This configuration results in one desirable form that makes the amplifying sensitivity greater. An example to which this form is applied is of a phase change memory or a phase change memory module in which the level of a read voltage like a bit line precharge voltage is limited low. That is, the memory cells are phase change memory cells (MC11 through MCmn). Upon the read operation, a discharge current flows through the first signal line according to a resistance value of each selected phase change memory cell. Upon the read operation, a discharge current lying between a discharge current value corresponding to a high resistance value of each phase change memory cell and a discharge current value corresponding to a low resistance value thereof flows through the second signal line.

As another desirable form or configuration for enhancing the amplifying sensitivity, the first signal line and the second signal line are discharged from the first level upon the read operation. The first level is of a level higher than half of a differential voltage between the first level and the second level, and p channel types (MP14, MP15) can be adopted for the second MOS transistors, and n channel types (MN14, MN15) can be adopted for the first MOS transistors. An example to which this form is applied, is a static memory or a static memory module which brings the level of a read voltage like a bit line precharge voltage to a relatively high level close to a source or power supply voltage. That is, each of the memory cells is a static memory cell. Upon the read operation, currents complementarily flow through the first and second signal lines according to stored information of each selected static memory cell.

As another concrete form or configuration of the present invention, the data latch circuit (DL, DL2) includes input MOS transistors (MP5, MP6, MN18, MN19) which receive outputs of the preamplifier at gates thereof, and a static latch supplied with operating power supplies through the input MOS transistors. The gates of the input MOS transistors are provided as the input nodes (SAIN, SAINB) and input/output terminals of the static latch are provided as the output nodes (SAOT, SAOB). According to this, when the separated state is released upon the read operation, the input MOS transistors responds to the transfer of electrical charges between the first and second signal lines and the input nodes of the data latch circuit with good sensitivity and contribute to speed up the latch operation of the data latch circuit. At this time, a third initialization circuit (PC3, PC7) which initializes output nodes of the data latch circuit to a third level opposite in polarity to the second level, may be adopted.

As a further concrete form or configuration of the present invention, there is provided a semiconductor integrated circuit wherein the data latch circuit comprises a static latch having input/output terminals made common to the input and output nodes.

[2] A semiconductor integrated circuit according to the present invention is provided with a readout circuit (RC) which detects a difference between a discharge current flowing through a first signal line (CBL) according to a resistance value of each selected phase change memory cell and a reference current flowing through a second signal line (CBLdm), based on a current value between a discharge current value corresponding to a high resistance of each phase change memory cell and a discharge current value corresponding to a low resistance thereof, thereby to determine stored information. The readout circuit includes a first initialization circuit (PC1) which initializes the first signal line and the second signal line to a first level before the start of a read operation thereof, a preamplifier (PA) which amplifies changes in initialization levels of the first and second signal lines respectively upon the read operation and outputs the same therefrom, a data latch circuit (DL) which receives a pair of outputs of the preamplifier at input nodes (SAIN, SAINB) thereof to perform a latch operation, and a second initialization circuit (PC2) which initializes input nodes of the data latch circuit to a second level higher than the first level before the start of the read operation. The preamplifier includes a pair of p channel type first MOS transistors (MP1, MP2) one of which receives the first signal line at a gate thereof and couples the first signal line to the corresponding input node of the data latch circuit through an input gate capacitance and the other of which receives the second signal line at a gate thereof and couples the second signal line to the corresponding input node of the data latch circuit through an input gate capacitance, and a pair of n channel type second MOS transistors (MN3, MN4) which couples the one first MOS transistor to the first signal line and couples the other first MOS transistor to the second signal line and which is on-operated after the initialization. It is thus possible to enhance amplifying sensitivity of the second MOS transistors and realize a high-speed read operation.

The data latch circuit (DL) includes p channel type input MOS transistors (MP5, MP6) which receive outputs of the preamplifier at gates thereof, and a static latch supplied with operating power supplies through the input MOS transistors. The gates of the input MOS transistors are provided as the input nodes (SAIN, SAINB) and input/output terminals of the static latch are provided as the output nodes (SAOT, SAOB). At this time, the readout circuit preferably further includes a third initialization circuit which initializes output nodes of the data latch circuit to a third level opposite in polarity to the second level.

[3] A semiconductor integrated circuit according to the present invention is provided with a readout circuit (RC_C) which detects a difference between currents that complementarily flow through first and second signal lines according to stored information of each static memory cell selected by a corresponding word line thereby to determine the stored information. The readout circuit includes a first initialization circuit (PC5) which initializes the first signal line and the second signal line to a first level before the start of a read operation thereof, a preamplifier (PA1) which amplifies changes in initialization levels of the first and second signal lines respectively upon the read operation and outputs the same therefrom, a data latch circuit (DL2) which receives a pair of outputs of the preamplifier at input nodes thereof to perform a latch operation, and a second initialization circuit (PC6) which initializes input nodes of the data latch circuit to a second level higher than the first level before the start of the read operation. The preamplifier includes a pair of n channel type first MOS transistors (MN14, MN15) one of which receives the first signal line at a gate thereof and couples the first signal line to the corresponding input node of the data latch circuit through an input gate capacitance and the other of which receives the second signal line at a gate thereof and couples the second signal line to the corresponding input node of the data latch circuit through an input gate capacitance, and a pair of p channel type second MOS transistors (MP14, MP15) which couples the one first MOS transistor to the first signal line and couples the other first MOS transistor to the second signal line and which is on-operated after the initialization.

The data latch circuit (DL2) includes n channel type input MOS transistors (MN18, MN19) which receive outputs of the preamplifier at gates thereof, and a static latch supplied with operating power supplies through the input MOS transistors. The gates of the input MOS transistors are provided as the input nodes and input/output terminals of the static latch are provided as the output nodes. The readout circuit preferably further includes a third initialization circuit (PC7) which initializes output nodes of the data latch circuit to a third level opposite in polarity to the second level.

EFFECTS OF THE INVENTION

Advantageous effects obtained by a typical one of the inventions disclosed in the present application will be explained in brief as follows:

It is possible to perform necessary amplification in a short period of time using a preamplifier even though a read signal level for each bit line is small. High-speed reading can be carried out while the risk of stored information of each phase change memory cell being destroyed is being prevented before happens.

BRIEF DESCRIPTION OF THE DRAWINGS

FIG. 11 is a circuit diagram illustrating a readout circuit applicable to an SRAM or the like.

EXPLANATION OF REFERENCE NUMERALS 1, 1_A semiconductor integrated circuit
MC11 through MCmn memory cells
CBL, BLT first signal lines
CBLdm, BLB second signal lines
RC, RC_A, RC_B, RC_C readout circuits
PC1, PC4, PC5 first initialization circuits
PA, PA1 preamplifiers
DL, DL1, DL2 data latch circuits
PC2, PC6 second initialization circuits
MP1, MP2, MN14, MN15 first MOS transistors
MN3, MN4, MP14, MP15 second MOS transistors
MP5, MP6, MN18, MN19 input MOS transistors
SAIN, SAINB input nodes
SAOT, SAOB output nodes

BEST MODE FOR CARRYING OUT THE INVENTION

First Embodiment

Figure 2:
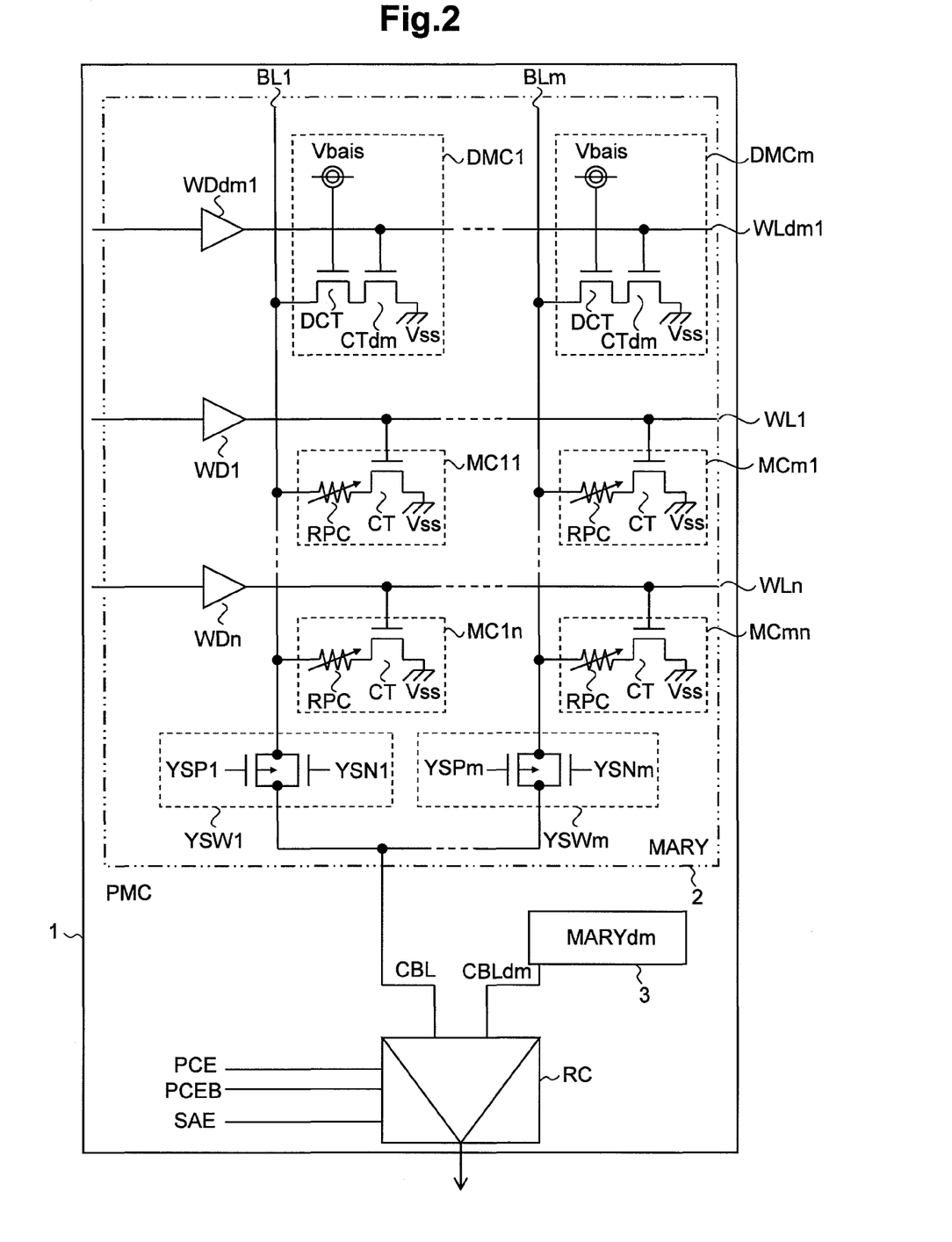
FIG. 2 is a circuit diagram illustrating the phase change memory module according to the present invention.

One example of a phase change memory module (PCM) 1 according to the present invention is shown in FIG. 2. The phase change memory module 1 shown in the same drawing may be a rewritable or programmable non-volatile memory on-chipped to a data processing LSI such as a microprocessor. Alternatively, the phase change memory module 1 may be a single non-volatile memory LSI.

A configuration focused on a stored information reading system is illustrated in FIG. 2. The phase change memory module 1 has a memory cell array (MARY) 2 and a dummy cell array (MARYdm) 3. Upon a read operation, the phase change memory module 1 reads a stored information signal outputted from the memory cell array to a common bit line CBL and a reference signal outputted from the dummy cell array 3 to a dummy common bit line CBLdm and supplies the same to a readout circuit RC. The readout circuit RC amplifies a difference between the two signals to discriminate stored information and outputs it therefrom.

The memory cell array (MARY) 2 has normal memory cells MC11 through MCmn disposed in matrix form, and dummy cell circuits DMC1 through DMCm each used for achieving matching with a parasitic capacitance component at a reference signal reading path in the dummy cell array 3. The dummy cell circuits DMC1 through DMCm will be described later along with the details of the dummy cell array 3.

The memory cells MC11 through MCmn respectively comprise series circuits of selection transistors CT and phase change elements RPC. One terminals of the series circuits are coupled to their corresponding bit line BL1 through BLm, and the other terminals thereof are coupled to circuit's ground terminals Vss. The gates of the selection transistors CT are coupled to their corresponding word lines WL1 through WLn. The word lines WL1 through WLn are selected by their corresponding word drivers WD1 through WDn. Although omitted from the drawing, each of the word drivers WD1 through WDn is supplied with a word line selection signal outputted from an X address decoder for decoding an X address signal. The bit lines BL1 through BLm are coupled to the common bit line CBL through Y switches YSW1 through YSWm. The Y switches YSW1 through YSWm respectively comprise CMOS transfer gates. An unillustrated Y address decoder for decoding a Y address signal generates each of Y selection signals YSP1, YSN1 through YSPm and YSNm which selectively switch-control them.

The phase change element RPC makes use of a substance called chalcogenide capable of performing switching between two stable states (amorphous state and crystal state) by heating. Since the resistance value of the chalcogenide is high when it is in the amorphous state and low when it is in the crystal state, the phase change element RPC stores one-bit information according to the switching between the states (the occurrence of a phase change). For example, such a reset pulse that the phase change element RPC is heated to greater than or equal to the melting point of a chalcogenide material and then cooled is inputted thereby to make it possible to bring the phase change element to the amorphous state. Such a set pulse that the phase change element is kept at a temperature higher than a crystallization temperature lower than the melting point and identical to or higher than a glass transition point is applied thereby to make it possible to bring the phase change element to the polycrystal state. Upon a read operation relative to the phase change element RPC having a phase change characteristic based on such a temperature, the voltage applied to each bit line must be set to a low level in such a manner that a change in stored information arising from eddy currents does not occur.

Figure 3:
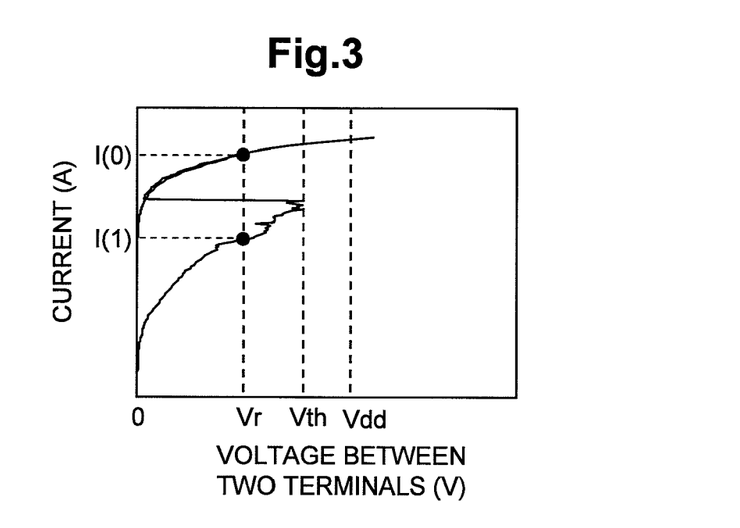
FIG. 3 is a characteristic diagram of a phase change element.

There is a possibility that as illustrated in FIG. 3 by way of example, the crystal state will change to the amorphous state or the amorphous state will change to the crystal state with the voltage (voltage between two terminals) applied across the phase change element RPC being made higher than a threshold voltage Vth. The voltage between the two terminals at the read operation must be set to a voltage Vr lower than the threshold voltage Vth.

The voltage between the drain and source of the selection transistor CT becomes a value obtained by voltage-dividing the bit line voltage in accordance with the resistance value of the phase change element RPC. Therefore, when a selection transistor CT coupled to its corresponding phase change element large in resistance value is selected by its corresponding word line, the current that flows through the selection transistor is relatively small. On the other hand, when a selection transistor CT coupled to its corresponding phase change element small in resistance value is selected by its corresponding word line, the current that flows through the selection transistor CT is relatively large. Upon the read operation, the dummy cell array 3 forms a current between the relatively large current that flows through the phase change element RPC small in resistance value and the relatively small current that flows through the phase change element RPC large in resistance value and forms a reference potential (reference signal) on the dummy common data line CBLdm, based on the current. The readout circuit RC amplifies the difference in potential between the common data line CBL and the dummy common data line CBLdm upon its data read operation and determines the logical value of read data.

Figure 4:
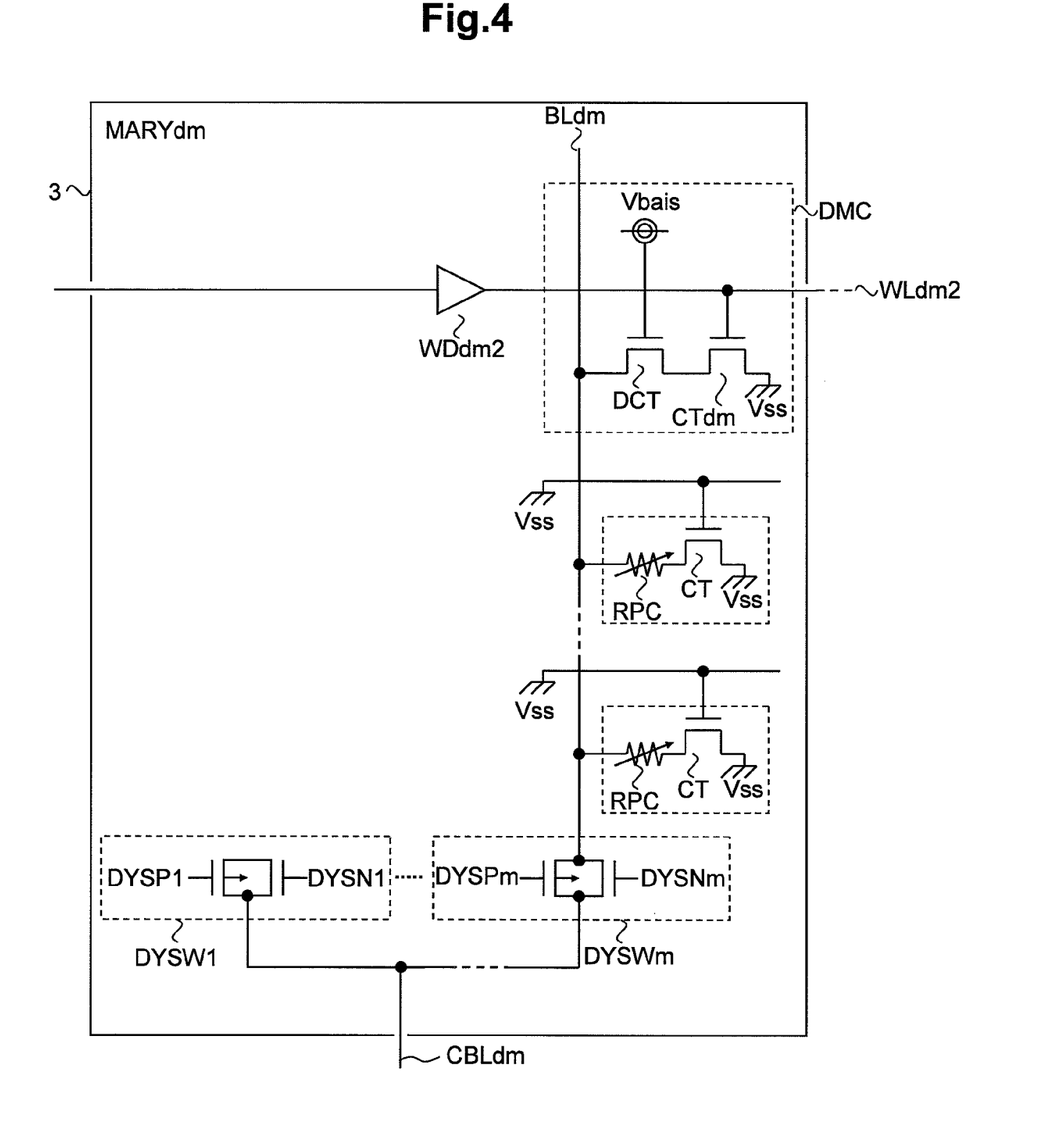
FIG. 4 is a circuit diagram of a dummy cell array.

The dummy cell array 3 is illustrated in FIG. 4 by way of example. The dummy cell array 3 has a dummy cell circuit DMC coupled to one dummy bit line BLdm. The dummy cell circuit DMC comprises a series circuit of a MOS transistor CTdm having a characteristic equivalent to that of the selection transistor CT of each memory cell, and a MOS transistor DCT for controlling a current characteristic in accordance with an external voltage Vbais. With the selection of the dummy cell circuit DMC by a dummy word line WLdm2, the dummy cell circuit DMC allows a current between a relatively large current that flows through a phase change elememt RPC small in resistance value and a relatively small current that flows through a phase change element RPC large in resistance value, to flow therethrough. Cell circuits identical to n memory cells MC whose CTs are always brought to an off state in such a manner that the same parasitic capacitance as that of one bit line in the memory cell array 2 is obtained, are coupled to the dummy bit line BLdm. From a viewpoint similar to it, dummy cell circuits DMC1 through DMCm are coupled to their corresponding bit lines BL1 through BLm of the memory array 2. In a manner similar to the dummy cell circuit DMC, each of the dummy cell circuits DMC1 through DMCm comprises a series circuit of a MOS transistor CTdm and a MOS transistor DMC biased at the voltage Vbais. The dummy word line WLdm1 of the memory cell array 2 is always non-selected by its corresponding dummy word driver WDdm1, and the dummy word line WLdm2 of the dummy cell array 3 is selected by its corresponding dummy word driver WDdm2 in sync with the timing provided to select each of the word lines WL1 through WLm.

The dummy bit line BLdm is coupled to its corresponding dummy common bit line CBLdm through a dummy Y switch DTSWm. Dummy Y switches DYSW1 through DTSWm−1 are coupled to the dummy common bit line CBLdm in such a manner that the parasitic capacitance thereof matches with that of the common bit line CBL. The dummy Y switches DYSW1 through DTSWm−1 are always kept off and the dummy Y switch DYSWm is brought to an on state in sync with the timing provided to bring each of the Y switches YSW1 through TSWm to an on operation.

Figure 1:
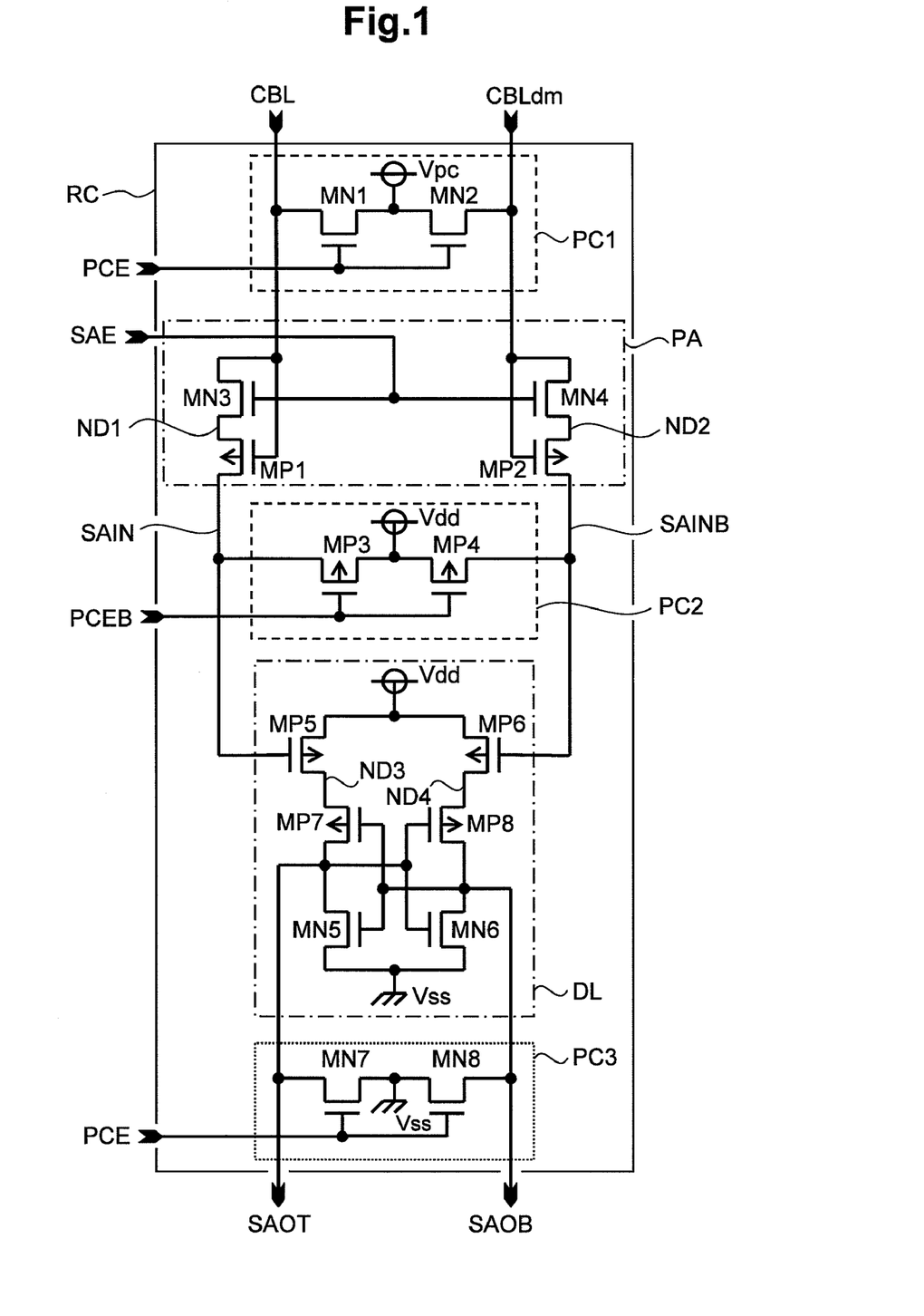
FIG. 1 is a circuit diagram illustrating a readout circuit applied to a phase change memory module according to the present invention.

A concrete example of the readout circuit RC is shown in FIG. 1. The readout circuit RC has a first initialization circuit PC1 which initializes the levels of a common data line CBL and a dummy common data line CBLdm upon its read operation, a preamplifier PA which amplifies a difference in potential between the common data line CBL and the dummy common data line CBLdm upon the read operation and outputs it therefrom, a data latch circuit DL which amplifies the output of the preamplifier and latches it therein, a second initialization circuit PC2 which initializes an input level of the data latch circuit DL upon the read operation, and a third initialization circuit PC3 which initializes an output level of the data latch circuit DL upon the read operation.

The first initialization circuit PC1 comprises n channel type precharge MOS transistors MN1 and MN2 which selectively supply a precharge voltage Vpc to the common data line CBL and the dummy common data line CBLdm. The precharge MOS transistors MN1 and MN2 are switch-controlled by a precharge signal PCE. The precharge voltage Vpc is of a voltage lower than a source or power supply voltage Vdd. This is because as apparent from FIG. 3, the precharge voltage applied to each bit line BL must be limited to prevent damage of the stored information with the voltage applied across the phase change element RPC going beyond the threshold voltage Vth. When the source voltage Vdd=1.5, for example, the precharge voltage is set to a voltage like Vpc=0.5V. Incidentally, the n channel type MOS transistors in the drawing are illustrated as distinguished from p channel type MOS transistors whose back gates are respectively marked with arrows.

The preamplifier PA has an n channel type MOS transistor MN3 and a p channel type MOS transistor MP1, and an n channel type MOS transistor MN4 and a p channel type MOS transistor MP2, both of which are coupled in series respectively. The MOS transistor MP1 has a gate coupled to the common data line CBL and a source coupled to an input node SAIN of the data latch circuit DL. The MOS transistor MP2 has a gate coupled to the common data line CBL and a source coupled to an input node SAINB of the data latch circuit DL. The MOS transistor MN3 selectively performs coupling and separation between the MOS transistor MP1 and the common data line CBL. The MOS transistor MN4 selectively performs coupling and separation between the MOS transistor MP2 and the dummy common data line CBLdm. The MOS transistors MN3 and MN4 are switch-controlled by a sense amp signal SAE.

The second initialization circuit PC2 comprises p channel type precharge MOS transistors MP3 and MP4 which selectively supply the source voltage Vdd to the input nodes SAIN and SAINB of the data latch circuit DL. The MOS transistors MP3 and MP4 are switch-controlled by an inverted signal (inverse precharge signal) of the precharge signal PCE.

The data latch circuit DL has a static latch comprised of p channel type MOS transistors MP7 and MP8 and n channel type MOS transistors MN5 and MN6. The static latch is provided with p channel type input MOS transistors MP5 and MP6 each of which supplies an operating power supply from the source voltage Vdd to the static latch. The input nodes SAIN and SAINB are coupled to the gates of the input MOS transistors MP5 and MP6.

The third initialization circuit PC3 comprises n channel type discharge MOS transistors MN7 and MN8 which selectively supply a ground voltage Vss to output nodes SAOT and SAOB of the data latch circuit DL. The MOS transistors MN7 and MN8 are switch-controlled by the precharge signal PCE.

After Y selection by the corresponding Y switch upon the data read operation, the common data lines CBL and CBLdm are precharged by the voltage Vpc in accordance with the precharge signal PCE prior to the word line selection timing, and the input nodes SAIN and SAINB are precharged by the voltage Vdd in accordance with the inverse precharge signal PCEB. In this state, the MOS transistors MN3 and MN4 are cut off so that the gate-to-source voltages of the MOS transistors MP1 and MP2 are respectively brought to a voltage corresponding to a difference between Vdd and Vpc. When the word line is selected and discharge for each bit line is started via the corresponding CT, a difference in potential is formed between the CBL and CBLdm. The difference in potential is reflected on the gate-to-source voltages of the two. With the turning on of the MOS transistors MN3 and MN4, the MOS transistors MN3 and MN4 respectively move electrical charges of the SAIN and SAIN to the CBL and CBLdm, based on large transconductance corresponding to the relatively large gate-to-source voltages thereof, thereby producing relatively large reductions in potential at the SAIN and SAINB while the difference in potential is being held. In accordance with the potential reductions at the SAIN and SAINB, the MP5 and MP6 are driven thereby to allow the supply of operating currents to the static latch to differ at the left and right output nodes SAOT and SAOB, whereby the static latch latches data according to the logical value of read data.

Figure 5:
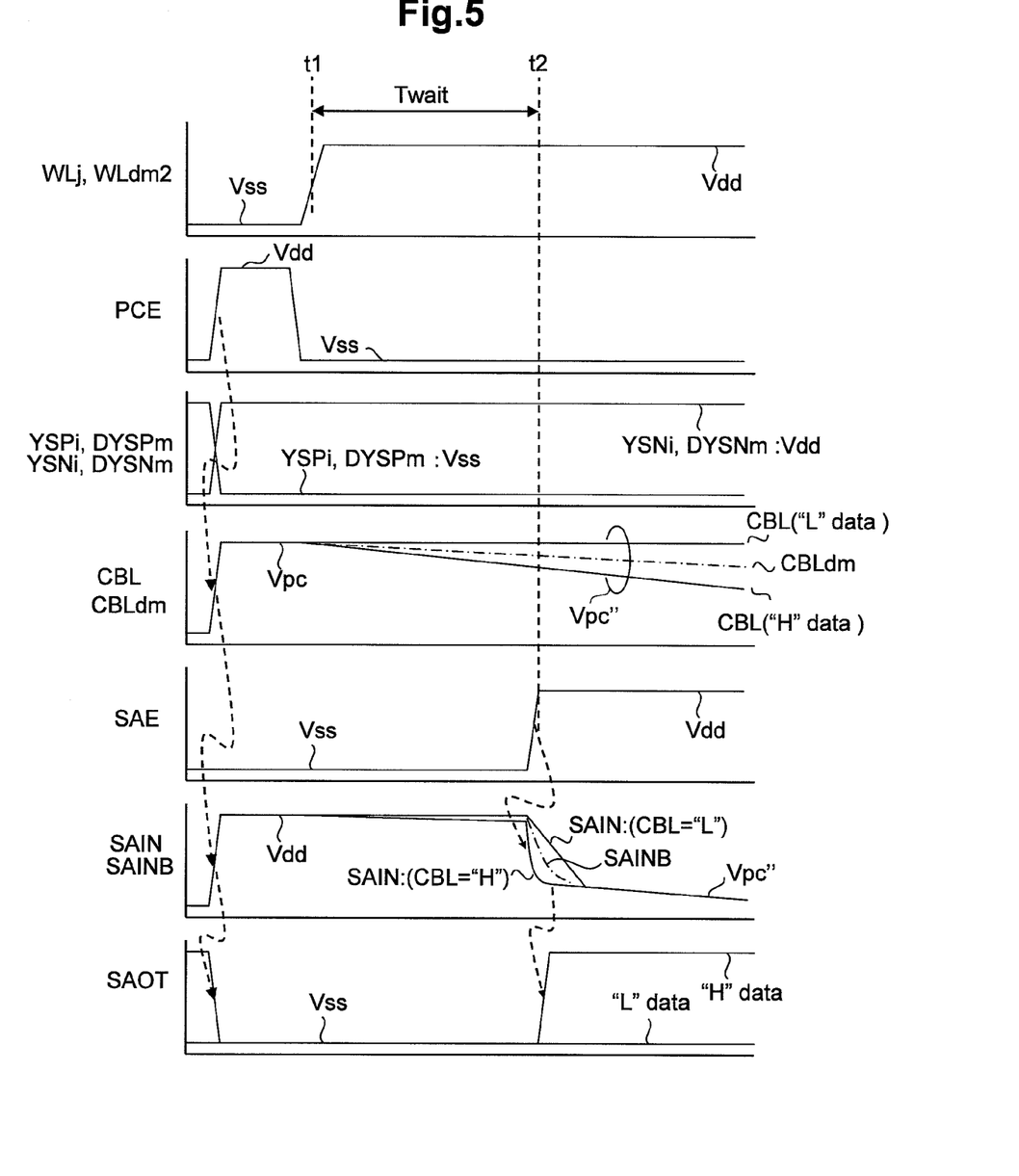
FIG. 5 is a timing chart showing a read operation of the phase change memory module of FIG. 2.

A timing chart for describing the read operation of the phase change memory module shown in FIG. 2 is illustrated in FIG. 5. With the reception of a Y address decode result, one YSWi of the Y switches YSW1 through YSWm and the dummy Y switch DTSWm are selected so that the bit line BLi corresponding thereto is coupled to the common data line CBL and the dummy bit line BLdm is coupled to the dummy common data line CBLdm. Thereafter, the precharge signal PCE is enabled so that the common data line CBL and the bit line BLi, and the dummy common data line CBLdm and the dummy bit line BLdm are respectively charged to the read voltage Vpc. The output nodes SAOT and SAOB and input nodes SAIN and SAINB in the readout circuit RC are also precharged with the same timing using the precharge signals PCE and PCEB. In accordance with the completion of their precharge, the precharge signals PCE and PCEB are disabled so that one word line WLj of the word lines WL1 through WLn and one dummy word line WLdm2 are driven to a selection level with the same timing using the corresponding word driver in accordance with the output of the X address decoder (t1). With the word line WLj and the dummy word line WLdm2 being driven to the selection level, current paths are formed in the phase change memory cell MC and the dummy cell circuit DMC via the selection MOS transistors CT and CTdm. Thus, when the corresponding phase change element RPC lying on a path for discharging the electrical charge stored in the bit line BLi thereby is in a low resistance state due to crystallization, a change in the voltage of the bit line BLi is large, whereas when the phase change element RPC is in a high resistance state due to amorphization, its voltage change is small. At this time, a voltage Vbias for controlling a current driving force of the dummy cell circuit DMC is set in such a manner that the voltages of the common data lines CBL and CBLdm can be compared with respect to both the low and high resistance states. After the potential difference necessary for the stable operation of the readout circuit RC has been formed between the common data line CBL and the dummy bit line BLdm, a sense amp enable signal SAE is enabled at a time t2 to start the latch operation of the data latch circuit DL. Consequently, complementary output data of the complementary output nodes SAOT and SAOB are determined. Here, the time taken from the enabling of the word line WLj and the dummy word line WLdm2 to the formation of the potential difference necessary for the stable operation between the common data line CBL and the dummy common data line CBLdm is defined as Twait.

Figure 6:
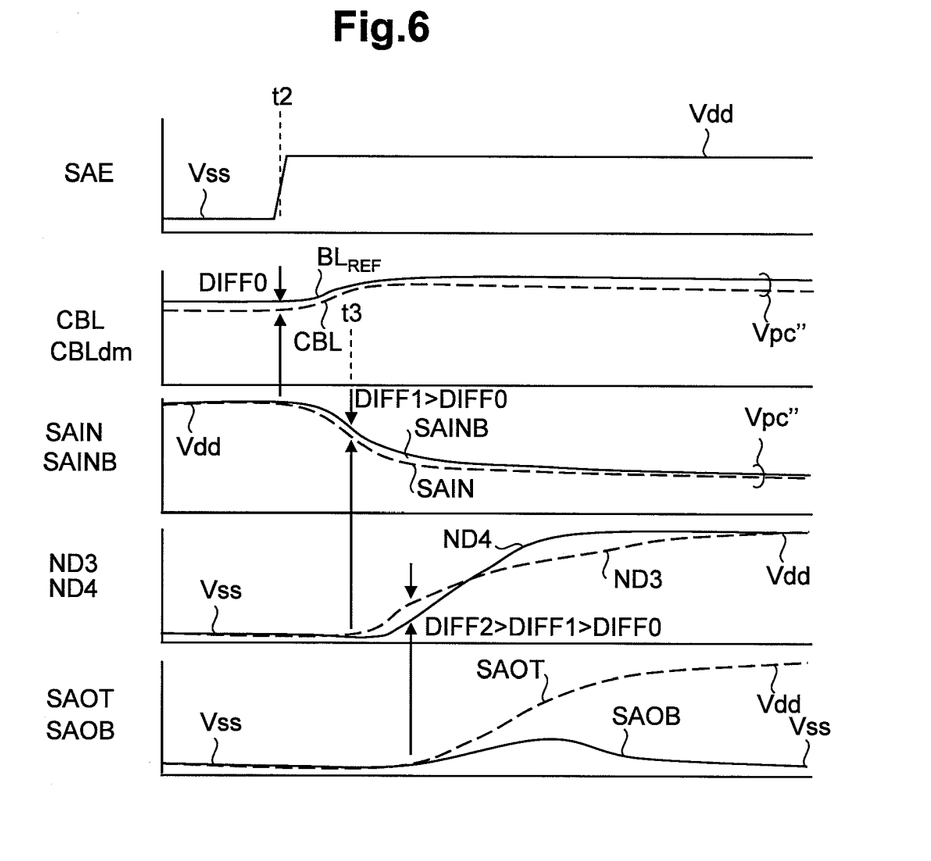
FIG. 6 is a detailed operating timing chart of the readout circuit.

Detailed operating timings of the readout circuit RC are illustrated in FIG. 6. Here, "H data" (at which the phase change element is in the low resistance state due to crystallization) reading will be shown by way of example. The corresponding word line has already been selected and the difference in potential has been formed between the common bit line CBL and the dummy common bit line CBLdm. The sense amp enable signal SAE is brought to a high level with the timing at which the difference in voltage DIFF0 between the common bit line CBL and the dummy common bit line CBLdm becomes a sufficient large value (time t2). Thus, the transistor pair MN3 and MN4 lying in the preamplifier PA is brought to an on state, so that electrical charges are transferred from the input nodes SAIN and SAINB of the data latch circuit DL to the common bit lines CBL and CBLdm and the bit line BLi and dummy bit line BLdm. The transistor pair MP5 and MP6 lying in the data latch circuit DL is turned on with the timing (t3) at which the voltages of the input nodes SAIN and SAINB of the data latch circuit DL are reduced and the difference in voltage therebetween becomes DIFF1. FIG. 6 shows the details of operating waveforms of the nodes SAIN, SAINB, ND3, ND4, SAOT and SAOB, which are formed or produced by the turning on thereof. That is, when the MOS transistors MN3 and MN4 are turned on, the electrical charges on the common bit lines CBL and CBLdm sides and the charged electrical charges of the node SAIN and SAINB are charge-shared, so that the voltage difference DIFF1 larger than the voltage difference DIFF0 between the common data lines CBL and CBLdm at that time occurs between the nodes SAIN and SAINB by this charge-share operation. As described above, the discharge operations are conducted at the common bit line CBL and the dummy common bit line CBLdm immediately before the charge sharing with the precharge voltage Vpc corresponding to such a low voltage as to make it possible to assure the prevention of damage of the stored information at the phase change element being taken as a base point. On the other hand, the nodes SAIN and SAINB are precharged to the source voltage Vdd on the data latch circuit DL side operated at the source voltage Vdd. At that time, the large gate-to-source voltages have been obtained at the MOS transistors MP1 and MP2. Thus, when the MOS transistors MN3 and MN4 are turned on from this state, the MOS transistors MP1 and MP2 perform the charge share with the relatively large transconductance. Consequently, the voltage difference DIFF1 larger than the voltage difference DIFF0 is immediately formed between the nodes SAIN and SAINB.

Since the MOS transistor pair MP5 and MP6 has drive capability corresponding to the voltages of the nodes SAIN and SAINB, there occurs a difference between velocities for charging the nodes ND3 and ND4. In the same figure, the output nodes SAOT and SAOB of the data latch start to be driven with the timing at which the difference in voltage between the nodes ND3 and ND4 is brought to a DIFF2 larger than the difference in voltage DIFF1 between the nodes SAIN and SAINB. Namely, since the node ND3 is faster than the node ND4 in charging operation in the example of FIG. 6, the charging level of the node SAOT will rise first, whereby the static latch determines the latch operation of bringing the node SAOT to a high level and bringing the node SAOB to a low level. Incidentally, the read voltage Vpc is designed in consideration of capacitances contained in the nodes SAINT and SAINB in such a manner that the voltages (each corresponding to a state of being brought to Vpc" in the same figure) of the common bit lines CBL and CBLdm and the bit line BL and dummy bit line BLdm, which rise by the charge-share operation, are brought to such a voltage as to hold the resistance of the phase change element RPC (i.e., a value at which the voltage between the two terminals shown in FIG. 3 is lower than the threshold voltage Vth).

According to the readout circuit RC, the following operative effects are obtained. A first point resides in that the time taken for amplification is shortened with an improvement in the drive capability of the preamplifier PA. When the MOS transistor pair MN3 and MN4 is brought to the on state by precharging the common data lines CBL and CBLdm to the first voltage Vpc and precharging the nodes SAIN and SAINB on the output side of the preamplifier PA to the second voltage Vdd (Vdd>Vpc), a voltage of a value approximately close to Vpc−Vdd is applied between the sources and drains of the transistor pair MP1 and MP2 lying within the preamplifier PA. The voltage (corresponding to a voltage approximately equal to the read voltage Vpc here) of each of the common data lines CBL and CBLdm is applied to the gate electrodes of the MOS transistor pair MP1 and MP2. Since the read voltage Vpc is suppressed to the voltage lower than the threshold voltage Vth in the phase change memory as mentioned above, the voltage of the value close to Vpc−Vdd has been applied between the sources and drains of the transistor pair MP1 and MP2 and the gates and sources thereof. Thus, since the transistor pair MP1 and MP2 is operated in a saturated region immediately after the preamplifier PA has been enabled, i.e., immediately after the MOS transistors MN3 and MN4 have been brought into conduction, more electrical charges can be transferred in a short period of time and the speeding-up of an amplifying operation is enabled.

A second point resides in that the preamplifier PA also has a capacitively coupled amp function owing to the MOS transistor pair MN3 and MN4. Namely, since the MOS transistor pair MN3 and MN4 is in a cutoff state before enabling of the sense amp enable signal SAE, the nodes SAIN and SAINB on the output side of the preamplifier PA and the common bit lines CBL and CBLdm have been cut off. On the other hand, since the nodes SAIN and SAINB on the output side of the preamplifier PA and the common bit lines CBL and CBLdm are coupled through or by their corresponding gate capacitances of the MOS transistor pair MP1 and MP2, potential variations in the bit lines under word line enable are transmitted to the nodes SAIN and SAINB on the output side of the preamplifier PA by capacitive coupling. Since the direction of the varied potentials of the nodes SAIN and SAINB on the output side of the preamplifier PA by the coupling lies in the same direction as a displacement subsequent to the amp enabling, the amplifying action of the preamplifier PA is enhanced.

A third point resides in that a timingless operation is realized owing to the adoption of the gate input type data latch circuit DL in which the P channel type MOS transistor pair MP5 and MP6 is used as the gate input transistors. Namely, the nodes SAIN and SAINB on the output side of the preamplifier PA are precharged to the source voltage Vdd using the precharge circuit PC2, thereby making it possible to hold the transistor pair MP5 and MP6 at standby in a cutoff state. The nodes SAOT and SAOB on the output side of the data latch circuit DL are precharged to the ground voltage Vss using the precharge circuit PC3, thereby making it possible to fix the internal nodes of the data latch circuit DL to the ground voltage Vss. Since the preamplifier PA and the data latch circuit DL can be started up by one sense amp enable signal SAE owing to the above configuration, a timing margin can be omitted. Namely, it is possible to shorten the time taken for the operation of the readout circuit RC. Owing to the characteristic items of the three points mentioned above, a slight difference in voltage can be amplified in a short period of time even in the case of the phase change memory small in memory cell current at the read operation.

Second Embodiment

Figure 7:
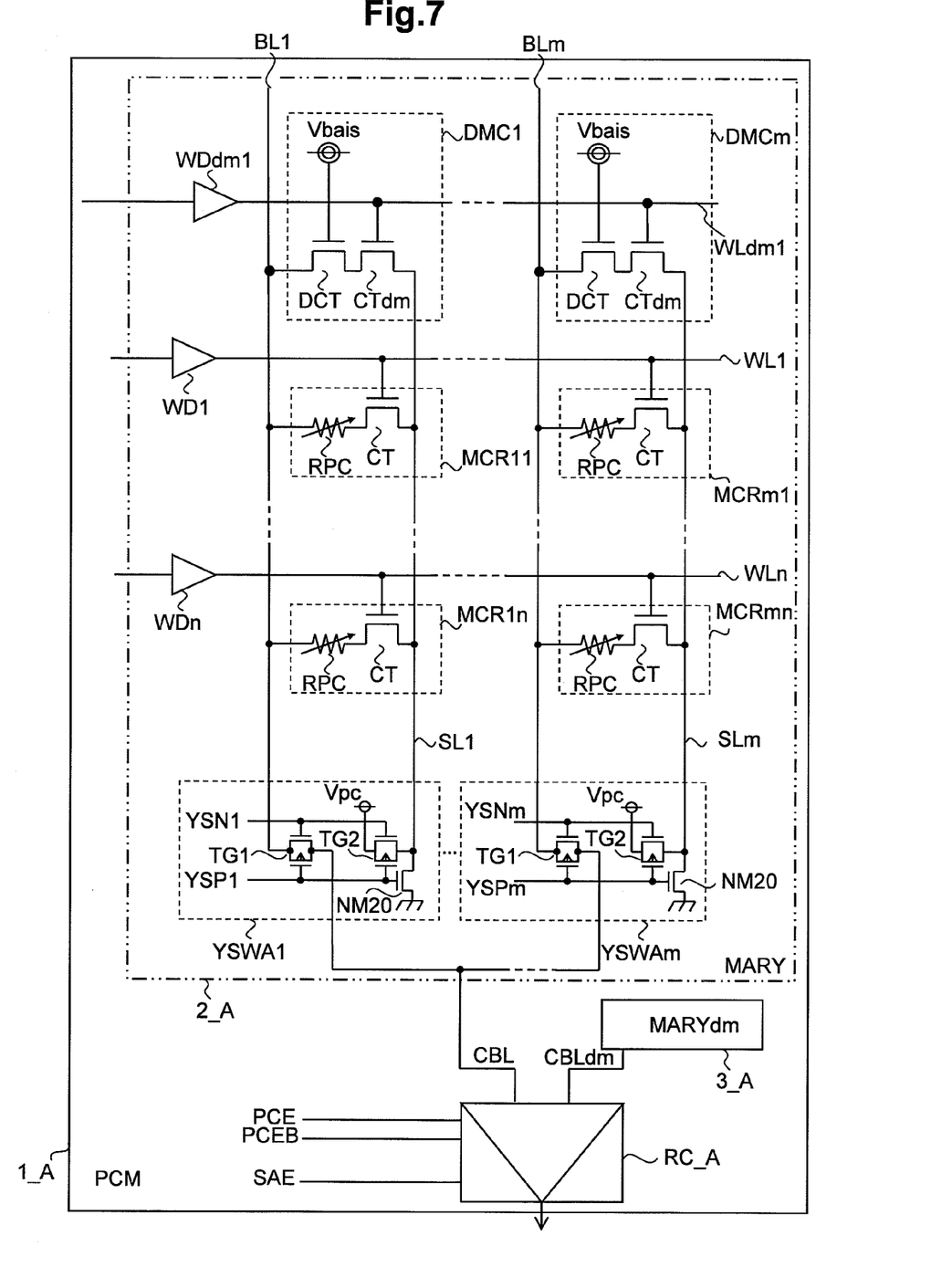
FIG. 7 is a circuit diagram illustrating another phase change memory cell module.

An example of another phase change memory cell module 1_A is shown in FIG. 7. A memory cell array 2_A for reading is different in configuration from one shown in FIG. 2. The following two are mentioned as the characteristics of this configuration. The first characteristic resides in that source lines SL1 through SLm are respectively disposed parallel to bit lines BL1 through BLm. Each of memory cells MCR11 through MCRmn comprises a phase change element RPC and a MOS transistor CT provided in series, both of which are inserted between the bit and source lines. Dummy memory cell circuits DMC1 through DMCm are also disposed in like manner. The second characteristic resides in that Y switches YSWA1 through YSWAm are disposed in units with one bit line and one source line as a pair. The Y switches YSWA1 through YSWAm comprise first CMOS transfer gates TG, second CMOS transfer gates TG2 and N channel type switch MOS transistors MN20 and are controlled by Y selection signals YSN1, YSP1 through YSNm and YSPm, respectively. The first CMOS transfer gate TG1 is inserted between its corresponding bit line and a common bit line CBL and couples the corresponding bit line selected by the Y selection signal to the common bit line CBL. The second CMOS transfer gate TG2 is inserted between its corresponding source line and a read voltage Vpc terminal and precharges the source line to a read voltage Vpc upon a read operation. The switch MOS transistor MN20 is inserted between the source line and a ground voltage Vss and drives each of the source lines SL1 through SLm to the ground voltage Vss on standby. A basic configuration of a dummy cell array 3_A is identical to that shown in FIG. 4, and the same difference as a point of difference of the memory cell array 2_A from the memory array 2 is reflected thereon.

Figure 8:
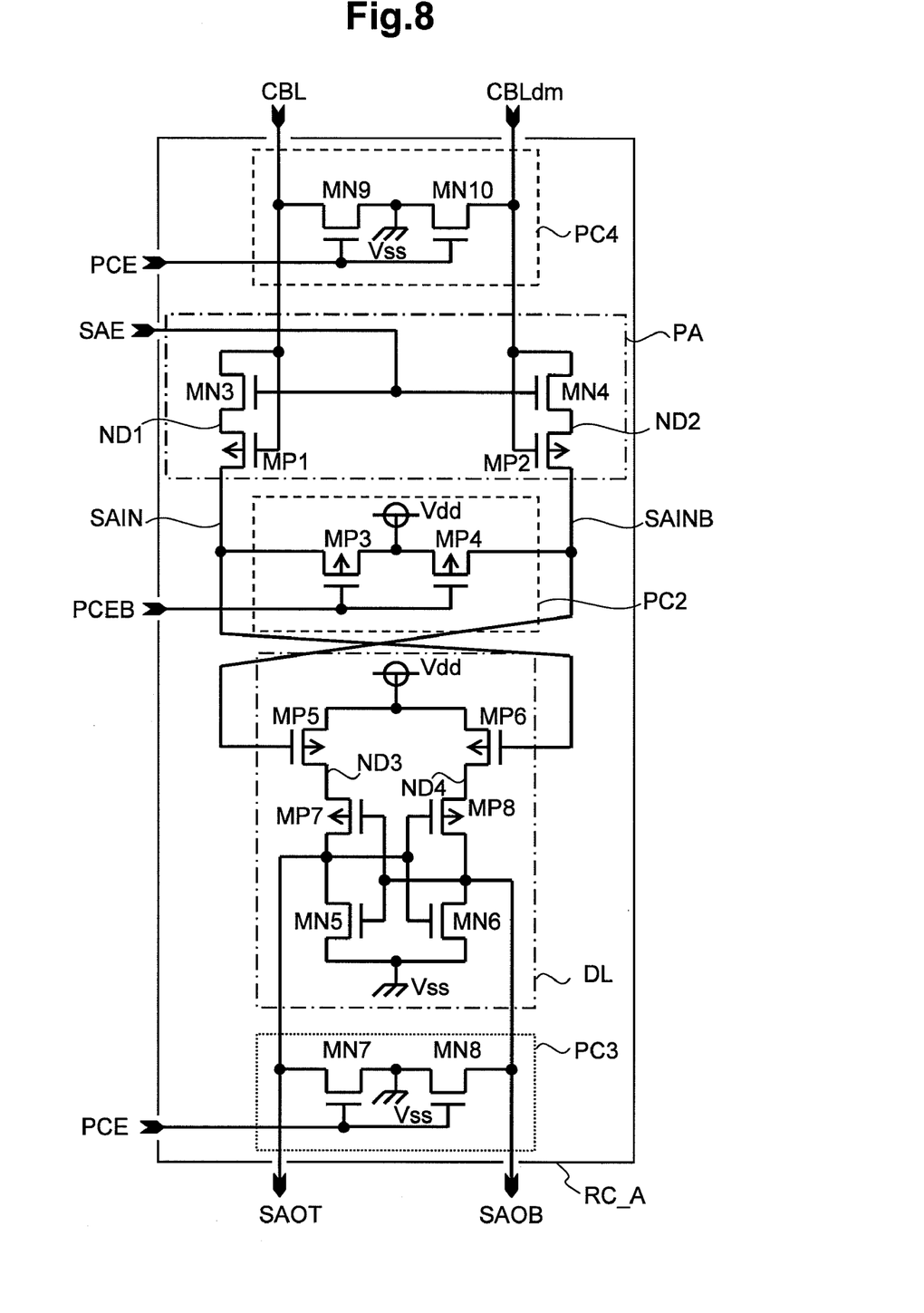
FIG. 8 is a circuit diagram illustrating the details of a readout circuit adopted in the phase change memory cell module shown in FIG. 7.

The details of a readout circuit RC_A adopted in the phase change memory cell module 1_A of FIG. 7 are illustrated in FIG. 8. The following two points are mentioned as points of difference between FIG. 8 and FIG. 1. The first point of difference resides in that the precharge circuit PC1 is replaced with PC4. The precharge circuit PC4 drives the common data lines CBL and CBLdm to the ground voltage Vss. The second point of difference resides in that the coupling between nodes SAIN and SAINB on the output side of a preamplifier PA and a data latch circuit DL is set in reverse. That is, the output node SAIN is coupled to its corresponding gate electrode of a transistor MP6 of the data latch circuit DL, whereas the output node SAINB is coupled to its corresponding gate electrode of a transistor MP5 of the data latch circuit DL. This change in coupling is done to match the operation of FIG. 8 with that of FIG. 5 for convenience, but is not essential. Since FIG. 8 is similar in other configuration to FIG. 1, its detailed explanations will be omitted.

Figure 9:
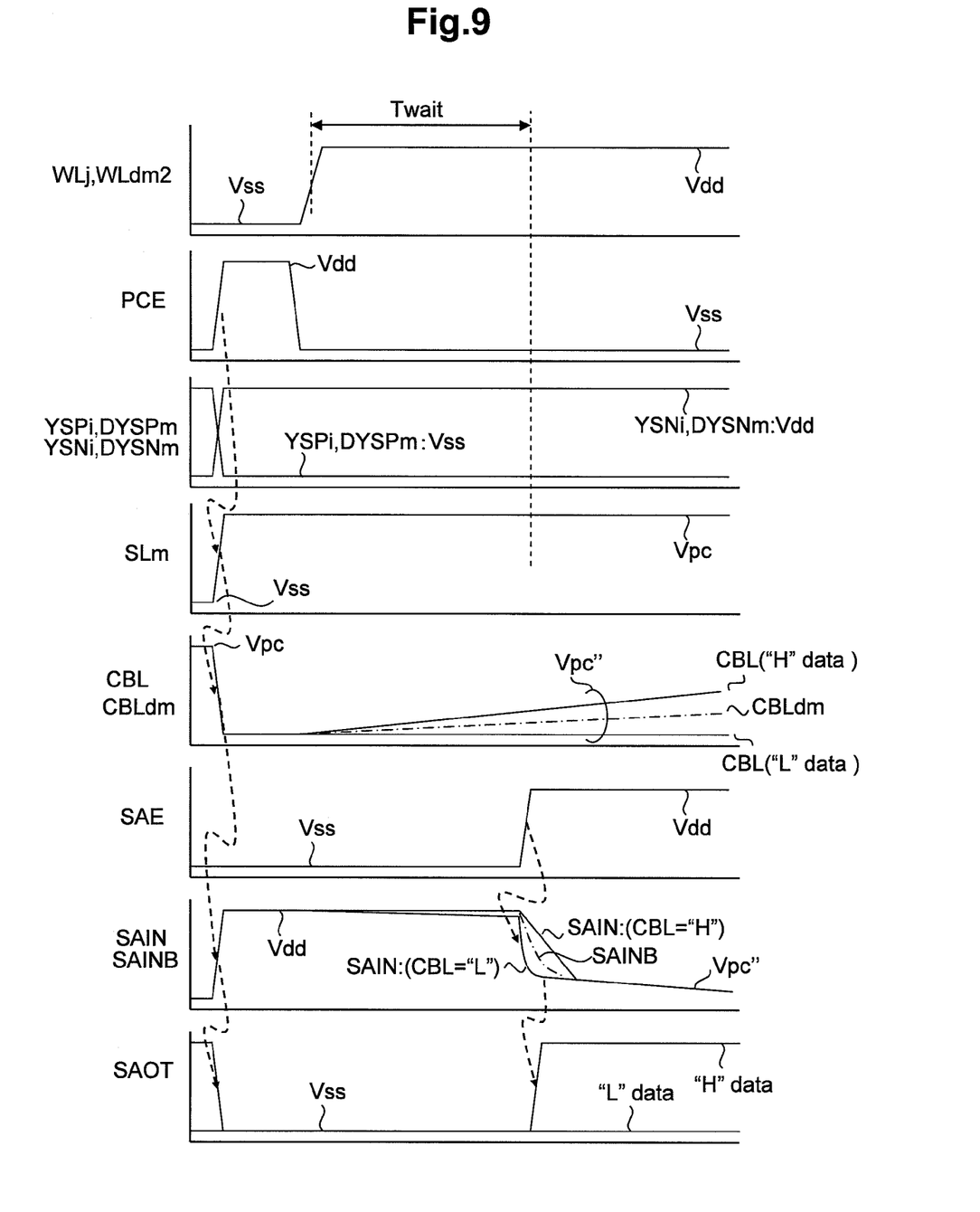
FIG. 9 is a timing chart of a read operation of the phase change memory module shown in FIG. 7.

Read operating timings executed in the phase change memory module 1_A shown in FIG. 7 are illustrated in FIG. 9. A bit line BLi and a dummy bit line selected by a Y address are precharged to the ground voltage Vss through CMOS transfer gates TG1 of their corresponding Y switch YSAi and dummy Y switch by the precharge circuit PC4 of FIG. 8. Further, a source line SL is charged to the read voltage Vpc through its corresponding CMOS transfer gate TG2. Next, one word line WLj and one dummy word line WLdm2 are selected after a precharge signal PCE has been disabled. Thus, since the electrical charge of the source line SL flows into the bit line BLi and the dummy bit line BLdm, the potentials of both lines start to rise gradually. Since the resistance of the phase change element is low when in a crystal state, a change in the voltage of the corresponding bit line is large. Since the resistance of the phase change element is high when in an amorphous state in reverse, the change in the voltage thereof is small. The common bit line CBL or CBLdm side low in potential rather than the nodes SAIN and SAINB on the output side of the preamplifier PA changes first, so the voltages of output nodes SAOT and SAOB of a cross-coupled data latch circuit DL to be described later are determined. This configuration promotes the speeding-up of the readout circuit RC_A as compared with FIG. 1. Namely, the signal voltages inputted to the preamplifier PA become lower than those in the first embodiment by the operation of injecting an electrical charge from the source line to the bit line to read stored information. Thus, since the gate-to-source voltage and source-to-drain voltage applied or inputted to a transistor pair MP1 and MP2 lying in the preamplifier PA become close to −Vdd, the initial drive capability of the transistor pair MP5 and MP6 increases. Accordingly, the time taken for the operation of the preamplifier PA can further be shortened, and higher speed reading of the phase change memory can be realized.

Third Embodiment

Figure 10:
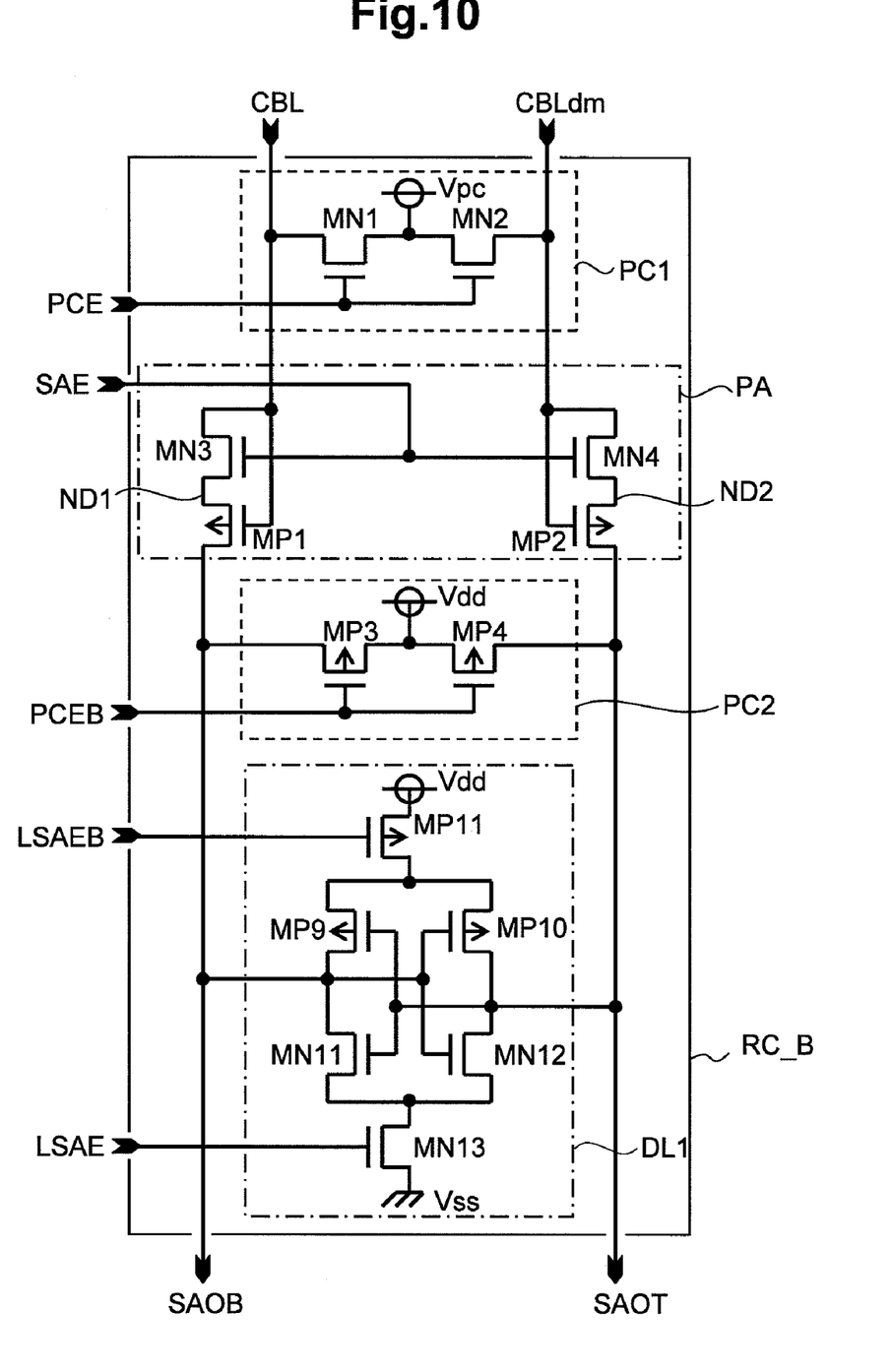
FIG. 10 is a circuit diagram illustrating the details of another readout circuit R adoptable in the phase change memory cell module shown in FIG. 1.

The details of another readout circuit RC_B adoptable for the phase change memory cell module 1 shown in FIG. 1 are illustrated in FIG. 10. A point of difference from FIG. 1 resides in that the outputs of a preamplifier PA are directly coupled to their corresponding sense nodes of a cross-coupled latch amplifier DLL Latch sense amp enable signals LSAE and LSAEB are enabled with the timing at which the difference between output signals of the preamplifier PA becomes maximum. In this configuration, the precharge circuit PC3 becomes unnecessary. Owing to such a configuration, the number of transistors employed in the readout circuit can be reduced, and a small-area and high-speed phase change memory can be realized.

Fourth Embodiment

Figure 11:
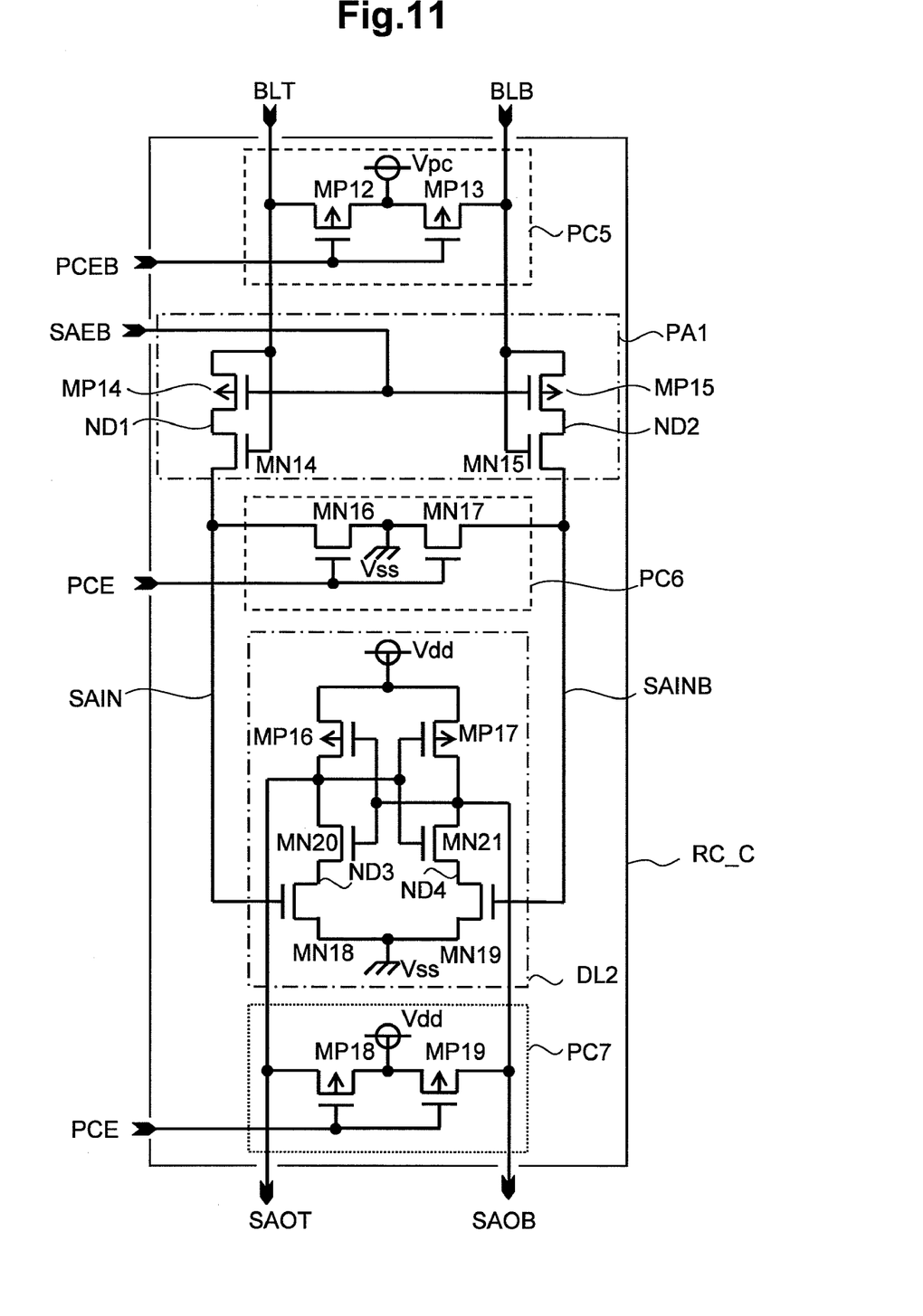

A further readout circuit is illustrated in FIG. 11. The readout circuit RC_C shown in the same figure is assumed to be applied to, for example, a memory which precharges each bit line to close to a source voltage Vdd to perform a read operation as in an SRAM (Static Random Access Memory), or a memory which performs a read operation without precharging each bit line to the full of the source voltage in order to reduce the influence of read disturb as in a flash memory. That is, the readout circuit is assumed to be applied to such a memory that a preamplifier and a data latch circuit are operated at the source voltage but the precharge of each bit line is conducted at a voltage close to the source voltage, which is lower than the source voltage. In this case, the readout circuit has a configuration reversed in polarity with respect to FIG. 1. Namely, in regard to the configuration example shown in FIG. 1, the locations of the n channel type MOS transistors are set as p channel type MOS transistors. Contrary to it, the locations of the p channel type MOS transistors are set as n channel type MOS transistors. The point of the source voltage Vdd is coupled to a ground voltage Vss and the point of the ground voltage Vss is coupled to the source voltage Vdd. The configuration and function of a precharge circuit are changed according to the above. The precharge circuit PC5 comprises two P channel type MOS transistors MP12 and MP13 which respectively drive complementary bit lines BLT and BLB to a read voltage Vpc. Here, the read voltage Vpc is of a voltage close to the source voltage Vdd or may be Vdd. A precharge circuit PC6 comprises two n channel type MOS transistors MN16 and MN17 which respectively drive nodes SAIN and SAINB on the output side of a preamplifier PA1 to the ground voltage Vss. Further, a precharge circuit PC7 comprises two p channel type MOS transistors MP18 and MP19 which respectively drive output nodes SAOT and SAOB of a data latch circuit DL2 to the source voltage Vdd.

With the enabling of a sense amp enable signal SAE under such a configuration, the preamplifier PA1 transfers electrical charges precharged to the bit lines to the nodes SAIN and SAINB on the output side of the preamplifier PA1. Low level (L) data is rapidly transmitted to the output node (SAOT, for example) of the data latch circuit DL2, corresponding to a preamp output (node SAIN, for example) high in bit line potential, so that the state of data latch by the data latch circuit DL2 is established earlier. When the respective MOS transistors are operated, high bias voltages are applied to the respective terminals by the precharge operation, thereby allowing more current to flow. With the flowing of the more current, data on the output side of the preamplifier PA1 is determined at a faster pace. Thus, even though the polarity of the circuit varies as in the case of a conductivity type of each MOS transistor or the form of coupling to the power supply and ground, operations and advantageous effects similar to the above embodiment can be obtained.

While the invention made above by the present inventors has been described specifically on the basis of the preferred embodiments, the present invention is not limited to the embodiments referred to above. It is needless to say that various changes can be made thereto within the scope not departing from the gist thereof.

INDUSTRIAL APPLICABILITY

The present invention can be widely applied to, as well as to a memory LSI such as a phase change memory, an SRAM or the like, a data processing LSI or the like equipped with such a memory module, which is typified by a microcomputer.

What is claimed is:

1. A semiconductor integrated circuit comprising:
a readout circuit which detects a difference between a change that appears on a first signal line and another change that appears on a second signal line, according to stored information of a memory cell selected from a plurality of memory cells, thereby to determine the stored information,
wherein the readout circuit includes:
a first initialization circuit which initializes the first signal line and the second signal line to a first level before the start of a read operation thereof,
a preamplifier which amplifies changes in initialization levels of the first and second signal lines respectively upon the read operation and outputs the same therefrom,
a data latch circuit which receives a pair of outputs of the preamplifier at input nodes to perform a latch operation, and
a second initialization circuit which initializes input nodes of the data latch circuit to a second level before the start of the read operation, and
wherein the preamplifier includes:
a pair of first MOS transistors one of which receives the first signal line at a gate thereof and couples the first signal line to the corresponding input node of the data latch circuit through an input gate capacitance and the other of which receives the second signal line at a gate thereof and couples the second signal line to the corresponding input node of the data latch circuit through an input gate capacitance, and
a pair of second MOS transistors which couples the one first MOS transistor to the first signal line and couples the other first MOS transistor to the second signal line and which is on-operated after the initialization.

2. The semiconductor integrated circuit according to claim 1,
wherein upon the read operation, the first signal line and the second signal line are discharged from the first level, and
wherein the first level is a level lower than the second level.

3. The semiconductor integrated circuit according to claim 2,
wherein the first level is a level lower than half of a differential voltage between the first and second levels,
wherein the first MOS transistors are p channel types, and
wherein the second MOS transistors are n channel types.

4. The semiconductor integrated circuit according to claim 3,
wherein each of the memory cells is a phase change memory cell,
wherein upon the read operation, a discharge current flows through the first signal line according to a resistance value of each selected phase change memory cell, and
wherein upon the read operation, a discharge current lying between a discharge current value corresponding to a high resistance value of each phase change memory cell and a discharge current value corresponding to a low resistance value thereof flows through the second signal line.

5. The semiconductor integrated circuit according to claim 2,
wherein upon the read operation, the first signal line and the second signal line are discharged from the first level,
wherein the first level is a level higher than half of a differential voltage between the first level and the second level,
wherein the first MOS transistors are n channel types, and
wherein the second MOS transistors are p channel types.

6. The semiconductor integrated circuit according to claim 5, wherein each of the memory cells is a static memory cell, and
wherein currents complementarily flow through the first and second signal lines according to stored information of each selected static memory cell, respectively.

7. The semiconductor integrated circuit according to claim 1,
wherein the data latch circuit includes input MOS transistors which receive outputs of the preamplifier at gates thereof, and a static latch supplied with operating power supplies through the input MOS transistors, and
wherein the gates of the input MOS transistors are provided as the input nodes and input/output terminals of the static latch are provided as the output nodes.

8. The semiconductor integrated circuit according to claim 7, further including a third initialization circuit which initializes output nodes of the data latch circuit to a third level,
wherein the third level is opposite in polarity to the second level.

9. The semiconductor integrated circuit according to claim 1, wherein the data latch circuit comprises a static latch having input/output terminals made common to the input and output nodes.

10. A semiconductor integrated circuit comprising:
a readout circuit which upon a read operation, detects a difference between a discharge current flowing through a first signal line according to a resistance value of each selected phase change memory cell and a reference current flowing through a second signal line, based on a current value between a discharge current value corresponding to a high resistance of each phase change memory cell and a discharge current value corresponding to a low resistance thereof, thereby to determine stored information,
wherein the readout circuit includes:
a first initialization circuit which initializes the first signal line and the second signal line to a first level before the start of a read operation thereof,
a preamplifier which amplifies changes in initialization levels of the first and second signal lines respectively upon the read operation and outputs the same therefrom,
a data latch circuit which receives a pair of outputs of the preamplifier at input nodes thereof to perform a latch operation, and
a second initialization circuit which initializes input nodes of the data latch circuit to a second level higher than the first level before the start of the read operation, and
wherein the preamplifier includes:
a pair of p channel type first MOS transistors one of which receives the first signal line at a gate thereof and couples the first signal line to the corresponding input node of the data latch circuit through an input gate capacitance and the other of which receives the second signal line at a gate thereof and couples the second signal line to the corresponding input node of the data latch circuit through an input gate capacitance, and a pair of n channel type second MOS transistors which couples the one first MOS transistor to the first signal line and couples the other first MOS transistor to the second signal line and which is on-operated after the initialization.

11. The semiconductor integrated circuit according to claim 10, wherein the data latch circuit includes p channel type input MOS transistors which receive outputs of the preamplifier at gates thereof, and a static latch supplied with operating power supplies through the input MOS transistors, and wherein the gates of the input MOS transistors are provided as the input nodes and input/output terminals of the static latch are provided as the output nodes.

12. The semiconductor integrated circuit according to claim 11, further including a third initialization circuit which initializes output nodes of the data latch circuit to a third level opposite in polarity to the second level.

13. A semiconductor integrated circuit comprising:

a readout circuit which detects a difference between currents that complementarily flow through first and second signal lines according to stored information of each static memory cell selected by a corresponding word line thereby to determine the stored information, wherein the readout circuit includes:

a first initialization circuit which initializes the first signal line and the second signal line to a first level before the start of a read operation thereof, a preamplifier which amplifies changes in initialization levels of the first and second signal lines respectively upon the read operation and outputs the same therefrom, a data latch circuit which receives a pair of outputs of the preamplifier at input nodes thereof to perform a latch operation, and a second initialization circuit which initializes input nodes of the data latch circuit to a second level higher than the first level before the start of the read operation, and wherein the preamplifier includes:

a pair of n channel type first MOS transistors one of which receives the first signal line at a gate thereof and couples the first signal line to the corresponding input node of the data latch circuit through an input gate capacitance and the other of which receives the second signal line at a gate thereof and couples the second signal line to the corresponding input node of the data latch circuit through an input gate capacitance, and a pair of p channel type second MOS transistors which couples the one first MOS transistor to the first signal line and couples the other first MOS transistor to the second signal line and which is on-operated after the initialization.

14. The semiconductor integrated circuit according to claim 13, wherein the data latch circuit includes n channel type input MOS transistors which receive outputs of the preamplifier at gates thereof, and a static latch supplied with operating power supplies through the input MOS transistors, and wherein the gates of the input MOS transistors are provided as the input nodes and input/output terminals of the static latch are provided as the output nodes.

15. The semiconductor integrated circuit according to claim 14, further including a third initialization circuit which initializes output nodes of the data latch circuit to a third level opposite in polarity to the second level.

* * * * *